(12) United States Patent
Abadir et al.

(10) Patent No.: US 9,329,229 B2
(45) Date of Patent: May 3, 2016

(54) INTEGRATED CIRCUIT WITH DEGRADATION MONITORING

(71) Applicants: Magdy S Abadir, Austin, TX (US); Puneet Sharma, Austin, TX (US)

(72) Inventors: Magdy S Abadir, Austin, TX (US); Puneet Sharma, Austin, TX (US)

(73) Assignee: FREESCALE SEMICONDUCTORS, INC., Austin, TX (US)

(*) Notice: Subject to any disclaimer, the term of this patent is extended or adjusted under 35 U.S.C. 154(b) by 172 days.

(21) Appl. No.: 13/956,126

(22) Filed: Jul. 31, 2013

(65) Prior Publication Data

US 2014/0132293 A1 May 15, 2014

Related U.S. Application Data

(63) Continuation-in-part of application No. 13/677,800, filed on Nov. 15, 2012.

(51) Int. Cl.
| | |
|---|---|
| *H03M 13/11* | (2006.01) |
| *G01R 31/28* | (2006.01) |
| *G01R 31/317* | (2006.01) |
| *H03K 3/037* | (2006.01) |

(52) U.S. Cl.
CPC ...... *G01R 31/2882* (2013.01); *G01R 31/31725* (2013.01); *H03K 3/0375* (2013.01)

(58) Field of Classification Search
CPC ....................................................... H04L 7/048
USPC ................. 714/775, 786, 780, 718, 708, 704; 370/335
See application file for complete search history.

(56) References Cited

U.S. PATENT DOCUMENTS

| | | | |
|---|---|---|---|
| 3,806,814 | A | 4/1974 | Forbes |
| 5,682,323 | A | 10/1997 | Pasch et al. |
| 6,425,117 | B1 | 7/2002 | Pasch et al. |
| 7,054,787 | B2 | 5/2006 | Gauthier et al. |
| 7,516,379 | B2 | 4/2009 | Rohrbaugh et al. |
| 7,903,613 | B2 * | 3/2011 | Ozluturk et al. .............. 370/335 |
| 7,929,498 | B2 * | 4/2011 | Ozluturk et al. .............. 370/335 |
| 8,081,003 | B2 | 12/2011 | Pacha et al. |
| 2008/0084228 | A1 | 4/2008 | Liu et al. |
| 2008/0104561 | A1 | 5/2008 | Carpenter et al. |

(Continued)

OTHER PUBLICATIONS

Oner, Hakan et al., "A Compact Monitoring Circuit for Real-Time On-Chip Diagnosis of Hot-Carrier Induced Degradation", Proc. IEEE 1997 Int. Conference on Microelectronic Test Structures, vol. 10, Mar. 1997, pp. 72-76.

(Continued)

*Primary Examiner* — Fritz Alphonse (57) ABSTRACT

An integrated circuit including a degradation monitoring circuit. The degradation monitoring circuit includes a comparison circuit having a programmable delay element including an input coupled to a data node of a timing path and having an output to provide a delayed signal of a data signal of the data node that is delayed by a programmable amount. The comparison circuit includes a logic comparator that provides a logic comparison between a data signal of the data node and the output of the delay element. The monitoring circuit includes a sampling circuit that provides a sampled signal of the output of the logic comparator that is a sampled with respect to a clock signal of the clock signal line. The monitoring circuit includes a hold circuit that provides a signal indicative of a data signal of the data node transitioning within a predetermined time of an edge transition of a clock signal of the clock signal line.

20 Claims, 6 Drawing Sheets

(56) References Cited

U.S. PATENT DOCUMENTS

| | | |
|---|---|---|
| 2009/0150656 A1 | 6/2009 | Abella et al. |
| 2009/0179689 A1 | 7/2009 | Bolam et al. |
| 2010/0214007 A1 | 8/2010 | Konstadinidis |
| 2011/0050247 A1 | 3/2011 | Marshall |
| 2011/0267096 A1 | 11/2011 | Chlipala et al. |

OTHER PUBLICATIONS

Bowman, K.A. et al., "Energy-Efficient and Metastability-Immune Timing-Error Detection and Instruction-Replay-Based Recovery Circuits for Dynamic-Variation Tolerance", IEEE International Conference on Solid-State Circuits, 2008, pp. 402, 403, 623.

Ernst, D. et al., "Razor: A Low-Power Pipeline Based on Circuit-Level Timing Speculation", Proceedings of the 36th International Symposium on Microarchitecture, IEEE, 2003, pp. 7-18.

Blaauw, D. et al., "Razor II: In Situ Error Detection and Correction for PVT and SER Tolerance", 2008 IEEE International Solid-State Circuits Conference, pp. 400-622.

Wang, X., et al., "Design and Analysis of a Delay Sensor Applicable to Process/Environmental Variations and Aging Measurements", IEEE Transactions on Very Large Scale Integration (VLSI) Systems, vol. 20, No. 8, Aug. 2012, pp. 1405-1418.

Agarwal et al., "Circuit Failure Prediction and Its Application to Transistor Aging", 25th IEEE VLSI Test Symposium, 2007, 8 pages.

Fuketa et al., "Adaptive Performance Compensation With In-Situ Timing Error Predictive Sensors for Subthreshold Circuits", IEEE Transactions on Very Large Scale Integration (VLSI) Systems, vol. 20, No. 2, Feb. 2012, pp. 333-343.

U.S. Appl. No. 13/677,800, Sharma, P., "Integrated Circuit With Degradation Monitoring", Office Action—Rejection, mailed Feb. 24, 2015.

Tsien, D. et al., "Context-specific leakage and delay analysis of a 65nm standard cell library for lithography-induced variability", IEEE International SOC Conference, Sep. 26-29, 2007, pp. 261-268.

Yu, S. et al., "A Pattern-Based Domain Partition Approach to Parallel Optical Proximity Correction in VLSI Designs", Proceedings of the 19th IEEE International Parallel and Distributed Processing Symposium (IPDPS'05), Apr. 4-8, 2005, 7 pages.

Kahng, A. et al., "Auxiliary pattern-based optical proximity correction for better printability, timing, and leakage control", Journal of Micro/Nanolithography, MEMS, and MOEMS, Jan.-Mar. 2008, vol. 7, Issue 1, 13 pages.

U.S. Appl. No. 13/677,800, Sharma, P., "Integrated Circuit With Degradation Monitoring", Office Action—Rejection, mailed Mar. 28, 2015.

U.S. Appl. No. 13/677,800, Sharma, P., "Integrated Circuit With Degradation Monitoring", Office Action—Notice of Allowance, mailed Nov. 6, 2015.

* cited by examiner

INTEGRATED CIRCUIT WITH DEGRADATION MONITORING

CROSS-REFERENCE TO RELATED APPLICATION(S)

This application is a continuation-in-part of U.S. patent application Ser. No. 13/677,800, filed on Nov. 15, 2012, entitled "Integrated Circuit with Degradation Monitoring," naming Puneet Sharma, Matthew A. Thompson, and Willard E. Conley as inventors, and assigned to the current assignee hereof.

BACKGROUND

1. Field

This disclosure relates generally to integrated circuits, and more specifically, to degradation monitoring within an integrated circuit.

2. Related Art

As an integrated circuit ages, the integration circuit experiences circuit degradation which causes delay margins of the digital circuits to decrease over time. Circuit degradation may occur due to various physical phenomena which may result in slowing down transistors and interconnects over time, such as, for example, negative bias temperature instability (NBTI), positive bias temperature instability (PBTI), hot carrier injection, and electromigration. As the integrated circuit continues to age, the delay margins can continue decreasing to the point at which delay faults occur. These delay faults result in catastrophic failure of the integrated circuit without warning.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

As integrated circuits age, circuit degradation results in decreasing delay margins. In one embodiment, a degradation monitoring circuit is used to monitor delay margin over an integrated circuit's lifetime in order to indicate a warning when the delay margin reaches a critical point, prior the circuit degradation resulting in an actual delay fault or error. Furthermore, these degradation monitoring circuit can be used in various places throughout an integrated circuit, and their outputs can be aggregated in order to provide a warning external to the integrated circuit to indicate when a delay margin has reached a critical point and a delay fault is imminent. In one embodiment, a degradation monitoring circuit may include a programmable delay element which may be used, for example, to determine the margin error of an integrated circuit. This margin error may then be used to predict the remaining useful life of the integrated circuit.

Figure 1:
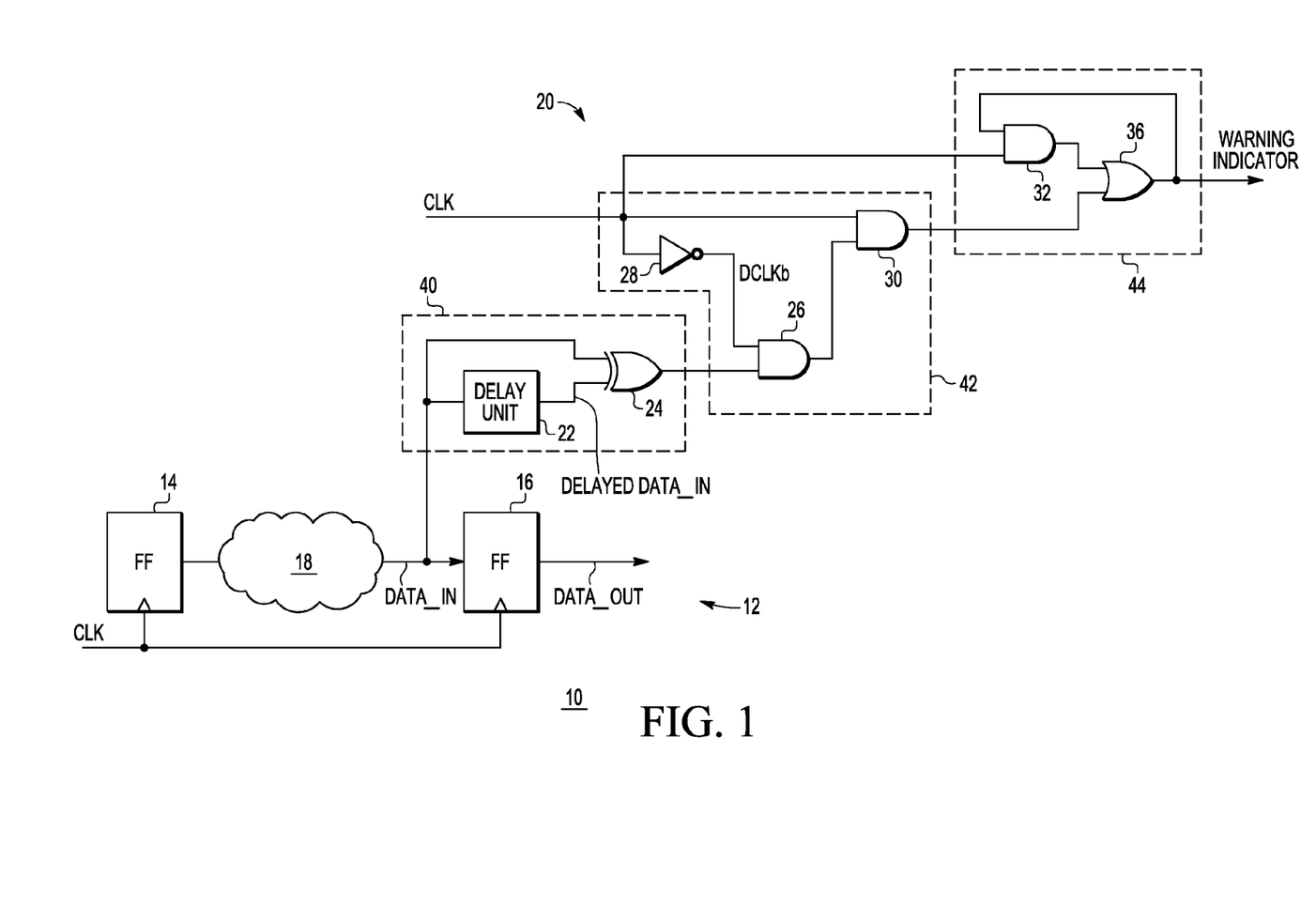
FIG. 1 illustrates, in partial schematic and partial block diagram form, an integrated circuit having a degradation monitoring circuit in accordance with one embodiment of the present disclosure.

FIG. 1 illustrates, in partial schematic and partial block diagram form, an integrated circuit (IC) 10, in accordance with an embodiment of the present disclosure. IC 10 includes a timing path 12 which includes a flip flop 14, combination logic 18, and a flip flop 16. The clock inputs of each of flip flops 14 and 16 is coupled to a clock signal line to receive a clock signal, CLK. Flip flop 16 provides its data output to combination logic 18, and combinational logic 18 provides a data input, DATA_IN, to flip flop 16. Note that DATA_IN may also be referred to as a data node. Combinational logic 18 can include any variety of logic gates and may receive additional inputs from other flip flops of IC 10. Therefore, combinational logic 18 is a cone of logic whose output is provided to the data input of flip flop 16. The output of flip flop 16, DATA_OUT, can be provided to other combinational logic of IC 10. Also, the data input of flip flop 14 can be provided by another cone of logic.

In order for flip flop 16 to operate correctly, the data value from combinational logic 18 must be valid on DATA_IN a sufficient margin before a triggering edge of CLK. For example, it will be assumed in the examples herein, that flip flops 14 and 16 operate as rising edge flip flops which are triggered by the rising edge of the clock. However, in other embodiment, they may be triggered by the falling edge. Therefore, if the data value is not valid a sufficient margin before the rising edge of the CLK, flip flop 16 will not latch or capture the correct value from combination logic 18. IC 10 therefore also includes a degradation monitoring circuit 20 coupled to DATA_IN to determine when transitioning of a data signal at DATA_IN reaches a critical margin before the rising edge of CLK. At this point, monitoring circuit 20 provides a warning indicator to indicate that the data signal (i.e. data value) at DATA_IN is transitioning too close to the rising edge of CLK. Upon timing path 12 further degrading, the data signal (i.e. data value) at DATA_IN transitions beyond the critical margin, and an actual delay default will occur in which flip flop 16 will not capture the correct data value.

Monitoring circuit 20 samples a data value at DATA_IN and a delayed data value at DATA_IN at a rising edge of CLK and generates a warning indicator when the values are different. For example, referring to FIG. 1, monitoring circuit 20 includes a comparison circuit 40 coupled to DATA_IN, a sampling circuit 42 coupled to an output of comparison circuit 40, and a hold circuit 44 coupled to an output of sampling circuit 42. Comparison circuit 40 includes a delay element 22 and an XOR gate 24. A first input of XOR gate 24 is connected to DATA_IN (the data input of flip flop 16), and a second input of XOR gate 24 is connected to an output of delay element 22. An input of delay element 22 is also connected to DATA_IN. Therefore, the output of delay element 22 provides a data value to the second input of XOR gate 24 that is delayed with respect to the data value of DATA_IN. Therefore, the output of delay element 22 can be referred to as a delay DATA_IN (DDATA_IN). The output of XOR gate 24 is asserted only when the values of DATA_IN and DDATA_IN are different, and negated otherwise.

Sampling circuit 42 has an inverter 28 and AND gates 26 and 30. Hold circuit 44 includes AND gate 32 and OR gate 36. Sampling circuit 42 and hold circuit 44 are each coupled to a same clock signal line as flip flops 14 and 16 and also receives a clock signal. In the illustrated embodiment, the clock signal provided to both sampling circuit 42 and hold circuit 44 is CLK, which is the same clock signal received at the clock inputs of flip flops 14 and 16. However, alternatively, either of these clock signals may be inverted clock signals, or other modified clock signals, taken from the same clock signal line.

Referring to sampling circuit 42, inverter 28 receives the clock signal, CLK, and outputs the inversion of CLK, CLKb. Furthermore, due to the delay introduced by inverter 28, CLKb is delayed with respect to CLK, and may therefore be referred to as delayed CLKb (DCLKb). Note that in alternate embodiment, inverter 28 may not be considered part of sampling circuit 42, in which case, sampling circuit 42 would receive clock signals CLK and DCLKb. A first input of AND gate 26 is coupled to the output of inverter 28 to receive CLKb, and a second input of AND gate 26 is coupled to the output of XOR gate 24 (i.e. the output of comparison circuit 40). A first input of AND gate 30 is coupled to the clock signal line to receive CLK, and a second input of AND gate 30 is coupled to an output of AND gate 26. An output of AND gate 30 provides a sampled output with respect to a rising edge of CLK of comparison circuit 40.

Referring to hold circuit 44, an output of OR gate 36 provides a warning indicator as the output of monitoring circuit 20 to indicate when the timing margin of flip flop 16 has reached a critical point. A first input of AND gate 32 is coupled to the output of OR gate 36 and thus receives, as feedback, the warning indicator. A second input of AND gate 32 is coupled to the clock signal line to receive CLK, and an output of AND gate 32 is coupled to a first input of OR gate 36. A second input of OR gate 36 is coupled to the output of AND gate 30 (i.e. the output of sampling circuit 42).

Still referring to FIG. 1, comparison circuit 40 includes a logic comparator which provides a logic comparison between a data value (i.e. data signal) of DATA_IN and a data value (i.e. data signal) at an output of delay element 22 (which produces a delayed data value of DATA_IN). The logic comparator may perform a logical XOR function (e.g. XOR gate 24). Sampling circuit 42 provides a sampled signal of the output of the logic comparator that is sampled with respect to a clock signal of the clock signal line. For example, this sampled signal may be sampled with respect to a rising or falling edge of the clock signal. Also, this sampled signal may be sampled at a portion of a clock cycle of a clock signal of the clock signal line. As will be described below, sampling circuit 42 performs a logical AND function of the input of inverter 28 (e.g. CLK), the output of inverter 28 (e.g. DCLKb), and the output of comparison circuit 40 (e.g. output of XOR gate 24). Hold circuit 44 provides a warning signal indicative of the data value of DATA_IN transitioning within a predetermined time of an edge transition of a clock signal of the clock signal line. Operation of monitoring circuit 20 will be described in further detail with respect to the timing diagram of FIG. 2.

Figure 2:
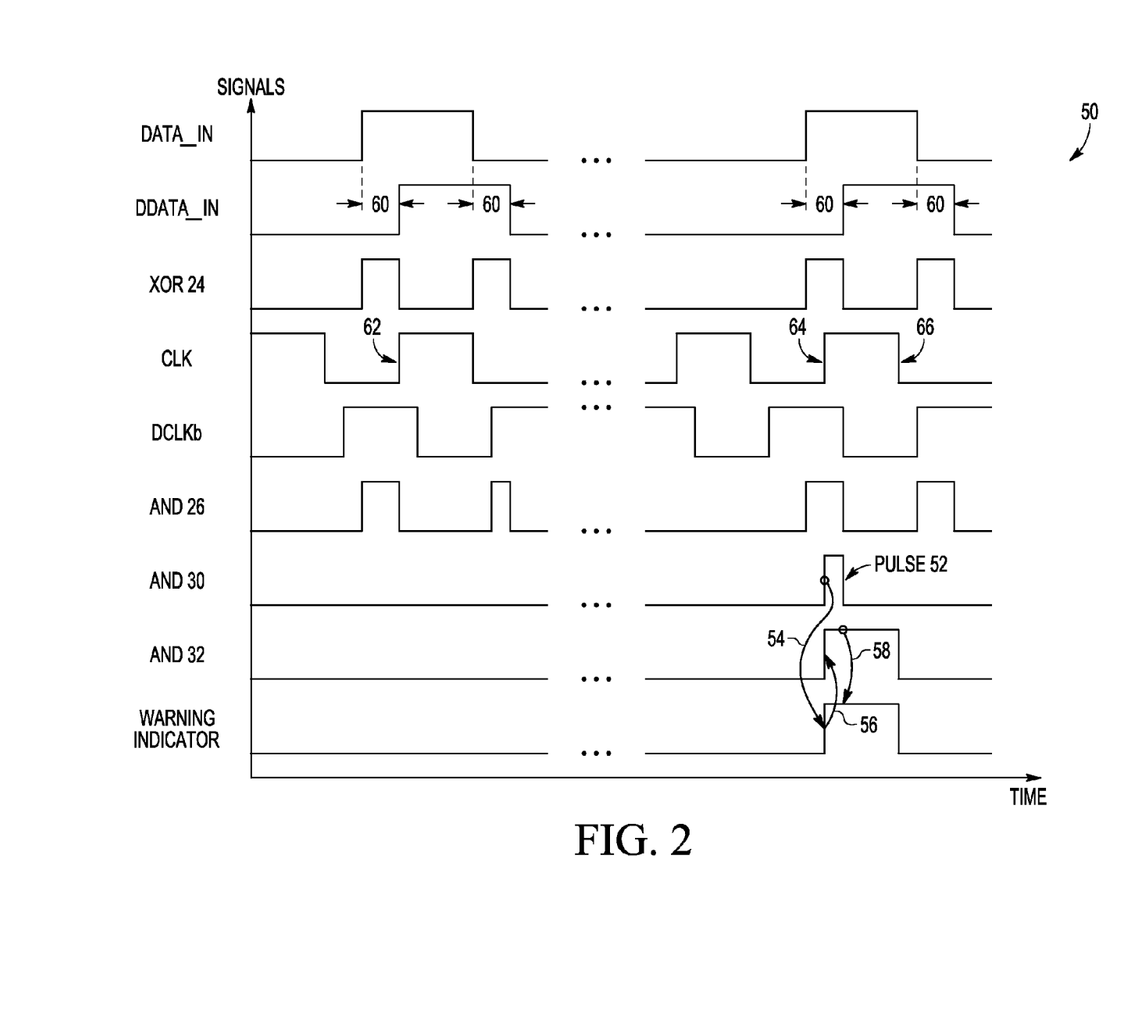
FIG. 2 illustrates, in timing diagram form, various signals of the integrated circuit of FIG. 1, in accordance with one embodiment of the present disclosure.

FIG. 2 illustrates, in timing diagram form, various signals of FIG. 1 in which the values of the signals on the left of the " . . . " correspond to values at a point in time of the lifetime of IC 10 in which correct operation of timing path 12 is not yet adversely affected by circuit degradation, and the value of the signal on the right of the " . . . " correspond to value during at a point in time of the lifetime of IC 10 in which circuit degradation has caused timing path 12 to reach a critical margin. That is, at this point in the lifetime of IC 10, a data value at DATA_IN transitions too closely to the rising edge of CLK (i.e., with a predetermined time of a rising edge of CLK) and thus a delay fault may be imminent.

First, the signals to the left of the " . . . " will be described first, in which circuit degradation has not yet become an issue for timing path 12. In FIG. 2, the data value at DATA_IN is assumed to transition from a zero (a low logic state) to a one (a high logic state). However, note that operation of the circuit is analogous for the data value at DATA_IN transitioning from a one to a zero. The data value of DDATA_IN (which as at the output of delay element 22) has the same value as DATA_IN, but is delayed by a time 60. This time 60 is determined be the length of delay provided by delay element 22, in which delay element 22 can be implemented in a variety of different ways, such as through the use of one or more buffers. When the data values at DATA_IN and DDATA_IN do not match, the output of XOR gate 24 (denoted as XOR24 on FIG. 2) is at a logic level high, and when they do match, at a logic level low. That is, the output of comparison circuit 40 provides indications when the data signal (at DATA_IN) and the delay data signal (at DDATA_IN) are at different logic state. Therefore, note that XOR24 is at a logic level high during time 60.

Sampling circuit 42 ensures that the comparison of the data values of DATA_IN and DDATA_IN are sampled with respect to a clock signal from the clock signal line. In the current example, sampling circuit 42 ensures that the comparison of the data values of DATA_IN and DDATA_IN are sampled with respect to the rising edge 62 of CLK. As illustrated in FIG. 2, DCLKb refers to the output of inverter 28 and therefore, the clock signal of DCLKb is inverted and delayed with respect to CLK. The output of AND gate 26 (denoted as the warning indicator in FIG. 2) is a logic level high only when both DCLKb and the output of XOR gate 24 (XOR24) are logic level highs. Therefore, as seen in FIG. 2, AND26 is a logic level high at two locations, at which XOR24 is a logic level high and DCLKb is a logic level high. The output of AND gate 30 (denoted as AND30 in FIG. 2) is a logic level high only when both CLK and the output of AND gate 26 (AND26) are high. Therefore, since AND26 is not at a logic level high at anytime during which CLK is a logic level one, AND30 remains a logic level zero.

Referring to hold circuit 44, the output of AND gate 32 (denoted AND32 in FIG. 2) receives CLK at one of its inputs. Therefore, whenever CLK is a logic level low, the output of AND gate 32 is low. With the output of AND gate 30 remaining low prior to circuit degradation taking effect, each time CLK is low, the output of OR gate 36 (i.e., the warning indicator) is reset to a logic level low. However, since the output of OR gate 36 is also fed back to an input of AND gate 32, so long as the output AND gate 30 remains low (as it does prior to degradation taking effect), the warning indicator will continuously remain at a logic level low. Therefore, in this example, since a valid data value (corresponding to a logic level high in this example) appears on DATA_IN a sufficient margin of time before rising edge 62 of CLK, no warning is indicated.

After operation of IC 10 over a period of time, circuit degradation adversely affects delay margins, and a valid data value (a logic level high in this example) appears on DATA_IN at a critical margin. That is, the valid data value appears within a predetermined time of a rising edge 64 of CLK which indicates that a critical margin has been reached and a delay default will soon occur after further circuit degradation. This situation is illustrated with the signals to the right of the "..." in FIG. 2, at which point circuit degradation has caused a critical margin for timing path 12 to be reached. Again, the data value at DATA_IN is assumed to transition from a zero (a low logic state) to a one (a high logic state). However, note that operation of the circuit is analogous for the data value at DATA_IN transition from a one to a zero. As described above, the data value of DDATA_IN (which is at the output of delay element 22) has the same value as DATA_IN, but is delayed by a time 60. When the data values at DATA_IN and DDATA_IN do not match, the output of XOR gate 24, XOR24, is at a logic level high, and when they do match, at a logic level low. Therefore, note that XOR24 is at a logic level high during time 60.

Sampling circuit 42 ensures that the comparison of the data values of DATA_IN and DDATA_IN is sampled in relationship to a clock signal. In this example, it is sampled in relationship to a rising edge of CLK, such as rising edge 64. As described above, AND26 is a logic level high only when both DCLKb and XOR24 are logic level highs. Therefore, as seen on the right side of FIG. 2, AND26 is a logic level high at two locations, at which XOR24 is a logic level high and DCLKb is a logic level high. AND30 is a logic level high only when both CLK and AND26 are high. In this case, since the transition of the data value at DATA_IN from a logic level low to high came in closer to rising edge 64 of CLK (as compared to rising edge 62 of CLK), there is a small period of time in which both AND26 and CLK are logic level ones, resulting in a pulse 52 at the output of AND 30. This pulse indicates that the data values of DATA_IN and DDATA_IN are different at the rising edge 64 of CLK. In this manner, pulse 52 is aligned with rising edge 64 of the CLK. Pulse 52, which indicates that the data values of DATA_IN and DDATA_IN are different, may therefore occur during an edge transition from a first clock state to a second clock state of a clock signal of the clock signals line. In this example, sampling circuit 42 samples the output of comparison circuit 40 with respect to the rising edge, but in alternate embodiment, sampling circuit 42 may sample the output of comparison circuit 40 with respect to a falling edge of a clock signals of the clock signal line. Alternatively, sampled circuit 42 may sample the output of comparison circuit 40 during any particular predetermined portion of a clock cycle of CLK.

Referring to hold circuit 44, the rising edge of pulse 52 at AND30 results in the value of the warning indicator (the output of OR gate 36) to go to a logic level high, as indicated by arrow 54 in FIG. 2. This logic level high is fed back to AND gate 32 which causes AND32 to go to a logic level high, as indicated by arrow 56 in FIG. 2. Furthermore, AND gate 32 also ensures that the value of the warning indicator at the output of OR gate 36 remains high so long as CLK remains high, as indicated by arrow 58. Upon a subsequent falling edge 66 of CLK, the output of AND gate 32 falls to a logic level low, and the warning indicator is reset to a logic level zero. (Note that upon falling edge 66 of CLK, although AND26 may be a logic level high again, AND30 is no longer a logic level high, thus the second input of OR gate 36 is also a logic level low.) Therefore, the warning indicator, when generated to indicate that a transition of the data value on DATA_IN occurs at a critical margin, is reset upon the subsequent falling edge of CLK. Note that hold circuit 44 thus holds its output (e.g. the warning indicator) at an indication state (e.g. a logic level high) for a particular amount of time, such as for a clock state (e.g. a logic high phase) of a clock signal of the clock line, to indicate the data value or signal at DATA_IN transitioning within a predetermined time of an edge transition (e.g. a rising edge of CLK) of the clock signal. Hold circuit 44 may then reset its output from the indication state to a second state (e.g. a logic low) at a transition to a next clock state (e.g. the next logic low phase) of the clock signal.

Alternate embodiments may use different circuit layouts for each of comparison circuit 40, sampling circuit 42, and hold circuit 44. For example, in one alternate embodiment, AND gates 26 and 30 may be replaced with a three-input AND gate which receives CLK, DCLKb, and the output of comparison circuit 40.

Figure 3:
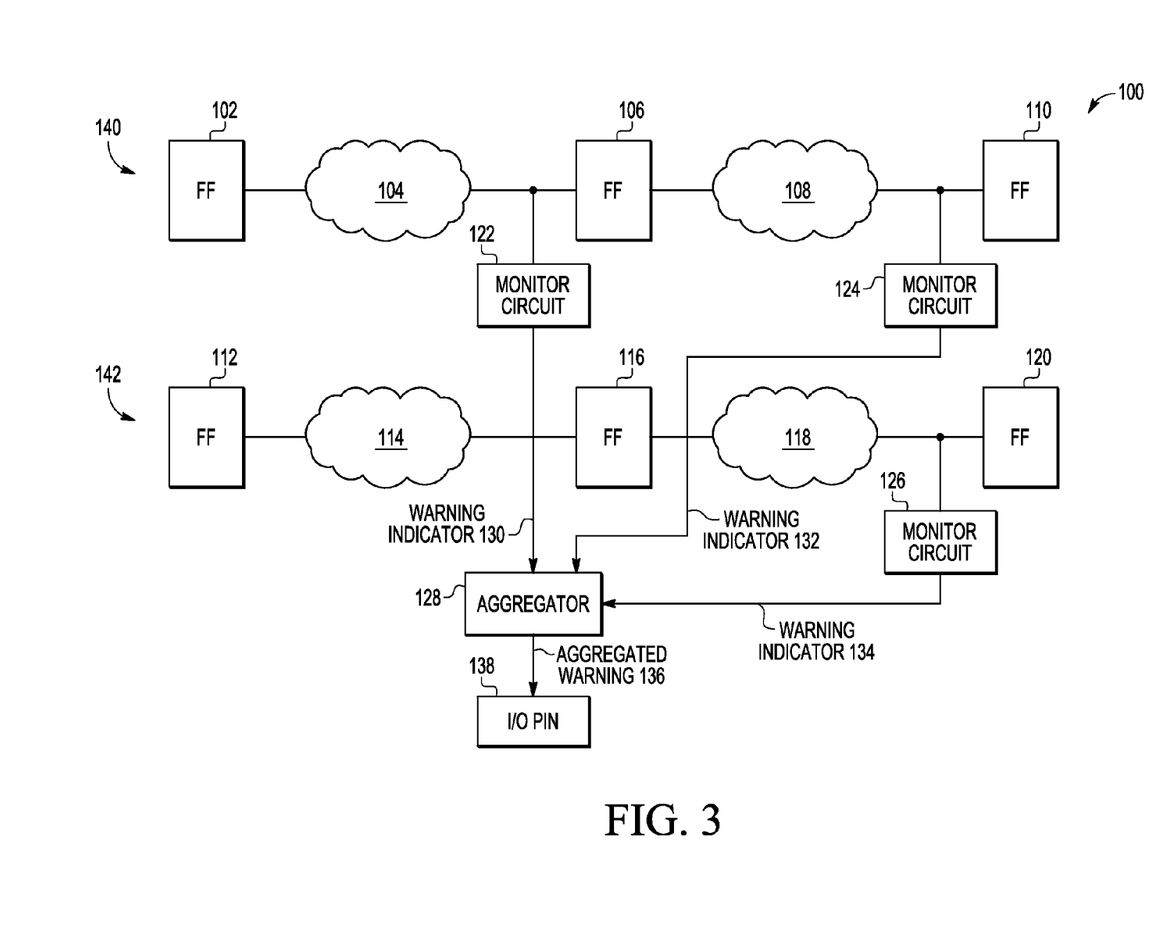
FIG. 3 illustrates, in block diagram form, an integrated circuit having various degradations monitoring circuit in accordance with one embodiment of the present disclosure.

FIG. 3 illustrates an IC 100 which includes a plurality of timing paths, such as timing paths 140 and 142. Note that IC 100 can includes any number of timing paths. Timing path 140 includes flip flops 102, 106, and 110, and combinational logic 104 coupled between flip flops 102 and 106, and combinational logic 108 coupled between flip flops 106 and 110. Timing path 142 includes flip flops 112, 116, and 120, and combinational logic 114 coupled between flip flops 112 and 116, and combinational logic 118 coupled between flip flops 116 and 120. Some timing paths of IC 100 may be more susceptible to circuit degradation than others. In some instances, these may includes critical timing paths. Alternatively, they may include delay paths with more of a particular type of devices, such as p-channel devices. Therefore, in one embodiment, monitoring circuits may be used at the data input node of flip flops in those timing paths or portions of timing paths that are most susceptible to delay faults due to circuit degradation. Therefore, in the illustrated example of FIG. 3, IC 10 includes a degradation monitoring circuit 122 connected to the data node at the input of flip flop 106, a degradation monitoring circuit 124 connected to the data node at the input of flip flop 110, and a degradation monitoring circuit 126 connected to the data node at the input of flip flop 120. However, note that no degradation monitoring circuit is connected to the data node at the input of flip flop 116. In this example, the cone of logic connected to the input of flip flop 116 may not benefit or sufficiently benefit from degradation monitoring. Note that each of degradation monitor circuits 122, 124, and 126 may be the same circuit as described above with respect to monitoring circuit 20.

IC 100 also includes an aggregator circuit 128 which receives the outputs of each of degradation monitor circuits 122, 124, and 126 (warning indicators 130, 132, and 134, respectively). In one embodiment, aggregator circuit 128 receives any warning pulses from any of the degradation monitors of IC 100 and provided an aggregated warning indicator 136. In one embodiment, aggregator circuit 128 may perform a logical ORing of all or a portion of the warning indicators within IC 100. Alternatively, aggregator circuit 128 may perform any function of the warning indicators to provide aggregated warning 136. Aggregated warning indicator 136 can be stored within IC 100 and may also be provided external to IC 100 via an external terminal, such as by way of an input/output (I/O) pin 138. In this manner, warning that a delay default is imminent in IC 100 may be signaled external to IC 100.

Also, note that in the embodiments described herein, a single tap into a timing path between two successive flips flops may be used to implement the degradation monitoring circuits. Also, note that for a degradation monitoring circuit, the comparison circuit compares a data value and delayed data value from an input a flip flop (e.g. comparison circuit 40 for flip flop 16), and need not also rely on an output of that flip flop (e.g. monitoring circuit 20 does not rely on the output of flip flop 16 for its monitoring). These aspects may result in reduced additional loading of the timing path as compared to current techniques.

Figure 4:
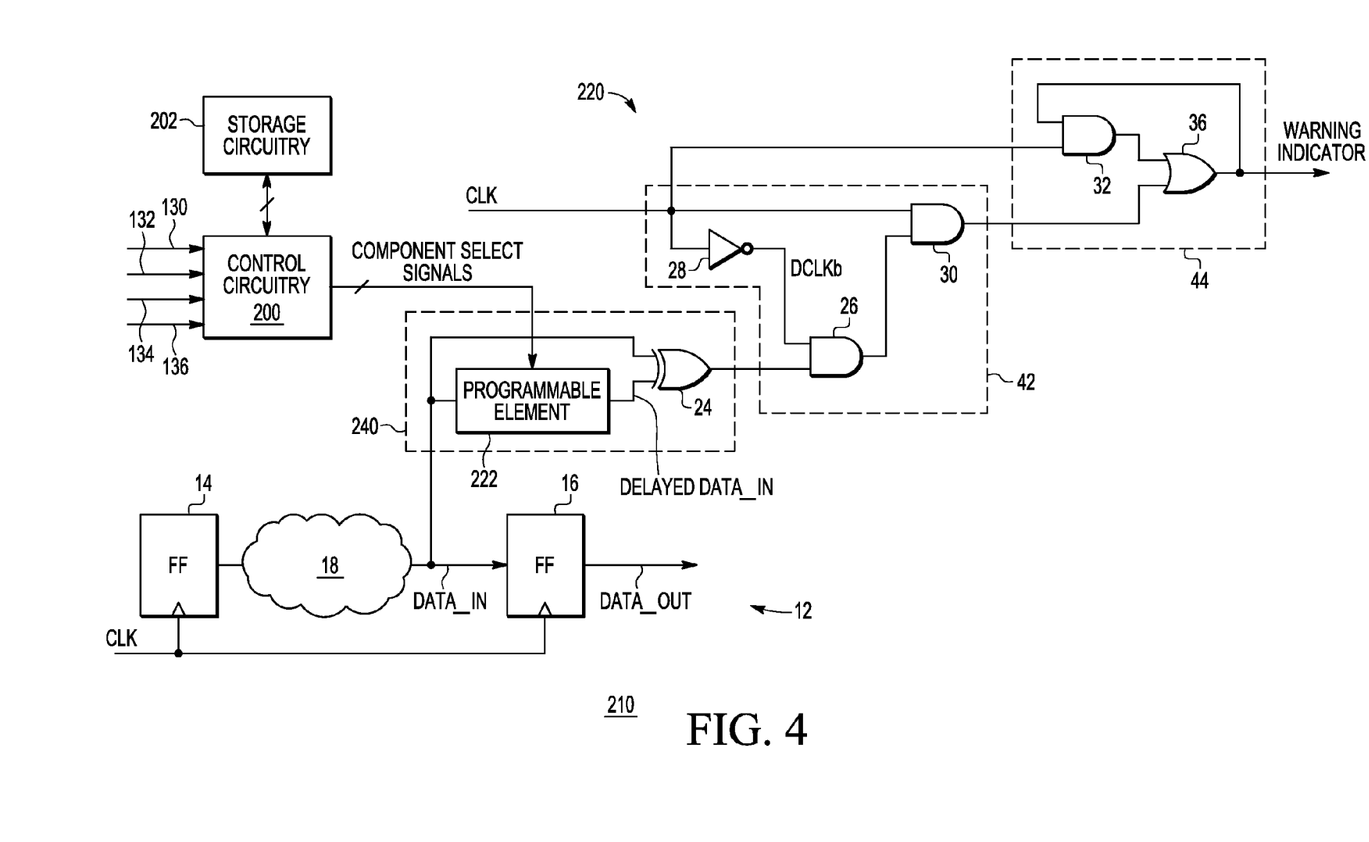
FIG. 4 illustrates, in partial schematic and partial block diagram form, an integrated circuit having a degradation monitoring circuit in accordance with one embodiment of the present disclosure.

FIG. 4 illustrates, in partial schematic and partial block diagram form, an integrated circuit (IC) 210, in accordance with an embodiment of the present disclosure. Note that like reference numerals indicate like elements, and many of the elements of FIG. 4 are similar to those described above in reference to FIG. 1. IC 210 includes timing path 12. As described above, the clock inputs of each of flip flops 14 and 16 is coupled to a clock signal line to receive a clock signal, CLK. Flip flop 16 provides its data output to combination logic 18, and combinational logic 18 provides a data input, DATA_IN, to flip flop 16. In order for flip flop 16 to operate correctly, the data value from combinational logic 18 must be valid on DATA_IN a sufficient margin before a triggering edge of CLK. IC 210 therefore also includes a degradation monitoring circuit 120 coupled to DATA_IN to determine when transitioning of a data signal at DATA_IN reaches a critical margin before the rising edge of CLK. At this point, monitoring circuit 220 provides a warning indicator to indicate that the data signal (i.e. data value) at DATA_IN is transitioning too close to the rising edge of CLK. Upon timing path 12 further degrading, the data signal (i.e. data value) at DATA_IN transitions beyond the critical margin, and an actual delay default will occur in which flip flop 16 will not capture the correct data value.

Degradation monitoring circuit 220 is similar to degradation monitoring circuit 20 of FIG. 1, except that comparison circuit 40 is replaced with comparison circuit 240 in which delay unit 22 is replaced with a programmable delay element 222. IC 210 also includes control circuitry 200 and storage circuitry 202 coupled to control circuitry 200. Control circuitry 200 may be coupled to receive one or more warning indicators, such as warning indicators 130, 132, 134, and 136. Note that comparison circuit 240 operates the same as comparison circuit 40, except that the amount of delay provided to produce DDATA_IN is programmable, and thus can be varied. That is, DDATA_IN is delayed with respect to DATA_IN by a programmable amount. In one embodiment, as will be described below, control circuitry 200 can program the delay provided by programmable delay unit 222. In the illustrated embodiment, control circuitry 200 sets the delay value by providing component select signals (which may be referred to as a delay signal) to programmable delay element 222.

Similar to monitoring circuit 20, monitoring circuit 220 samples a data value at DATA_IN and a delayed data value at DATA_IN at a rising edge of CLK and generates a warning indicator when the values are different. Note that comparison circuit 240 operates analogous to comparison circuit 40. Monitoring circuit 220 also includes sampling circuit 42 and hold circuit 44.

Figure 5:
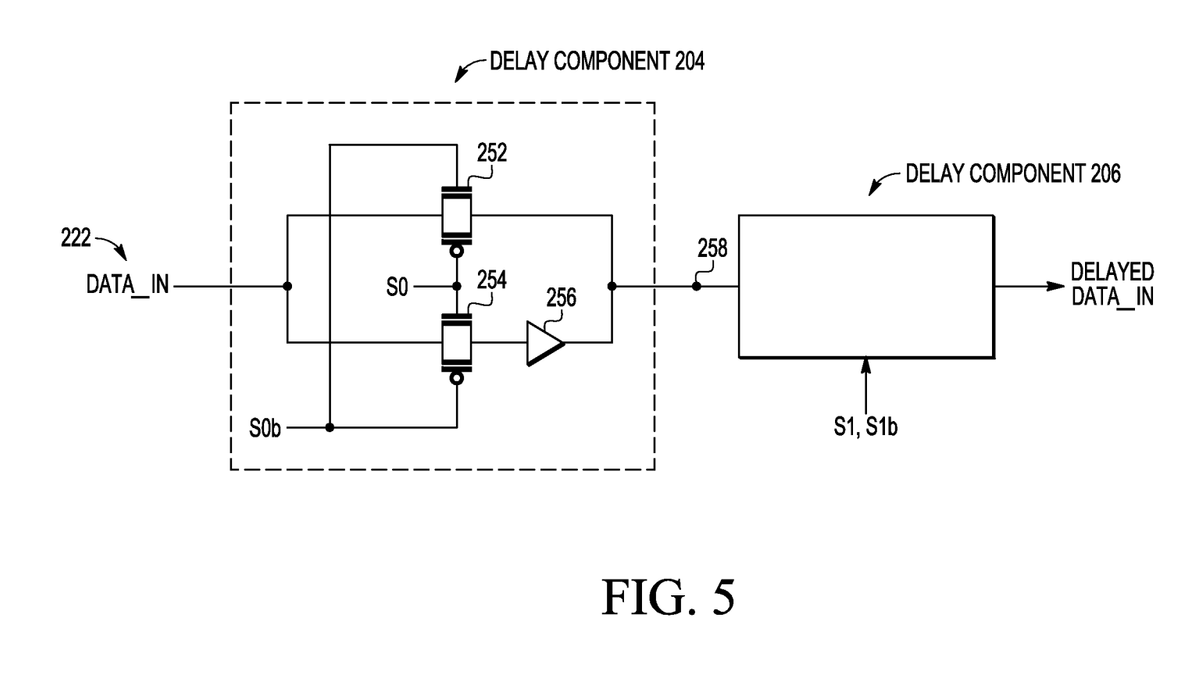
FIG. 5 illustrates, in schematic form, a programmable delay element in accordance with one embodiment of the present disclosure.

FIG. 5 illustrates, in schematic form, programmable delay element 222 in accordance with one embodiment. Programmable delay element 222 receives component select signals from control circuitry 200. In one embodiment, these component select signals include S0 and S1, in which complements of these signals, S0$b$ and S1$b$, respectively, may be generated within programmable delay element 222 with an inverter or provided by control circuitry 200. Programmable delay element 222 includes a delay component 204 and a delay component 206. Delay component 204 is controlled by component select signal S0, and delay component 206 is controlled by component select signal S1. In this embodiment, each of S0 and S1 may refer to a delay signal bit. Delay component 204 has a first input node coupled to receive DATA_IN, and an output coupled to node 258. Delay component 204 includes transmission gates 252 and 254 and a buffer 256. Transmission gate 252 has a first input coupled to receive DATA_IN, an output coupled node 258, a control input coupled to receive S0$b$, and an inverting control input coupled to receive S0. Transmission gate 254 has a first input coupled to receive DATA_IN, an output coupled to an input of buffer 256, a control input coupled to receive S0, and an inverting control input coupled to receive S0$b$. Buffer 256 has an output coupled to node 258.

In operation, delay component 204, based on the value of S0, provides a delayed or non-delayed value of DATA_IN at node 258. For example, if S0 is asserted, then S0$b$ is negated, and the path from DATA_IN through transmission gate 254 and buffer 256 is selected to provide a delayed value of DATA_IN at node 258. The delay is determined primarily by buffer 256. However, if S0 is negated, then S0$b$ is asserted, and the path from DATA_IN through transmission gate 252 is selected such that DATA_IN is provided at node 258 with minimal delay. Since this path provides minimal delay, it may be referred to as a non-delayed path. Similar circuitry is located within delay component 206 such that a delayed path or a non-delayed path can be selected by S1, S1$b$. That is, delay component 206 has an input node coupled to node 258 and an output node coupled to provide delayed DATA_IN. Control signals S1, S1$b$ determine whether the output of delay component 204 will go through a delayed or non-delayed path. Therefore, if both S0 and S1 are asserted, a delay is provided by both delay component 204 and 206 to provide delayed DATA_IN with the largest delay value. However, if S0 is asserted but S1 is negated, then only delay component 204 will provide a delay to provide delayed DATA_IN. In this manner, by varying the values of S0 and S1, different delays can be used to provide delayed DATA_IN. Furthermore, although only two cascaded delay components are illustrated, any number may be used to provide any number of different delay values. Alternatively, other circuitry configurations may be used to provide variable delays which may be set by control circuitry 200.

As was described above in reference to FIG. 2, after operation of IC 210 over a period of time, circuit degradation adversely affects delay margins, and a valid data value (a logic level high in the example of FIG. 2) appears on DATA_IN at a critical margin. That is, the valid data value appears within a predetermined time of a rising edge 64 of CLK which indicates that a critical margin has been reached and a delay default will soon occur after further circuit degradation. This situation is illustrated with the signals to the right of the "..." in FIG. 2, at which point circuit degradation has caused a critical margin for timing path 12 to be reached. With respect to monitoring circuit 220, time 60 is determined by the length of delay provided by programmable delay element 222. Therefore, time 60 can be varied by programmable delay element 222. In this manner, by varying time 60, control circuitry 200 may determine the largest time 60 (i.e. the largest margin) at which timing path 12 still operates correctly, without indicating a warning.

Figure 6:
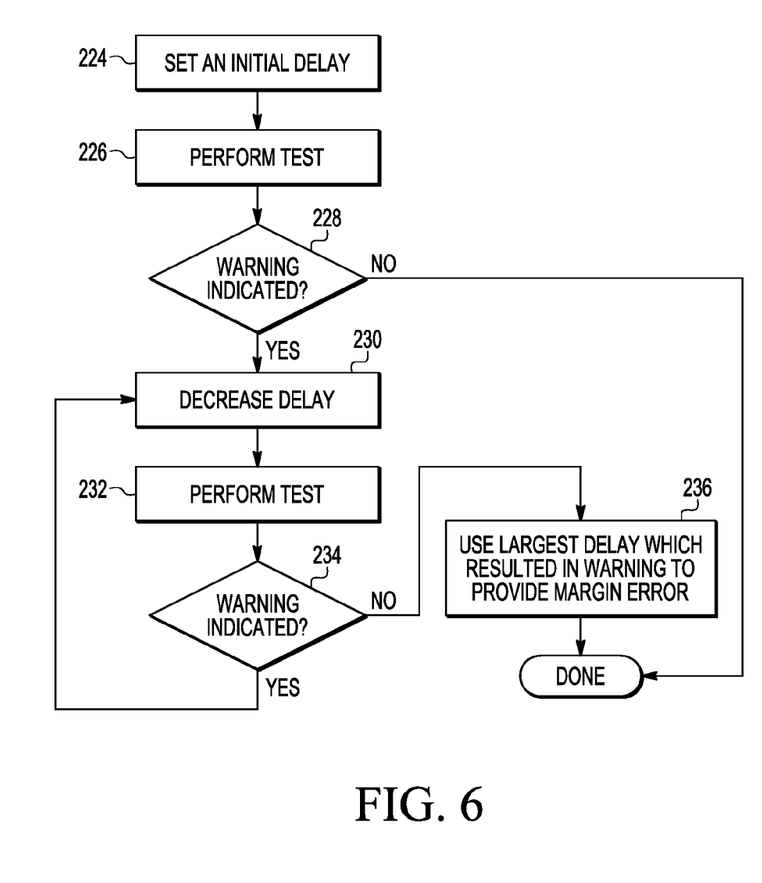
FIG. 6 illustrates, in flow diagram form, a method of operating the degradation monitoring circuit of FIG. 4 in accordance with one embodiment of the present disclosure.

FIG. 6 illustrates, in flow diagram form, a method for determining a margin error for IC 210 in accordance with one embodiment. FIG. 6 begins at block 224 in which an initial delay value is set for programmable delay element 222. This may be set by control circuitry 200 by way of the component select signals. The method continues to block 226 in which the initial delay value is used by monitoring circuit 220 to perform its test which determines whether the warning indicator is asserted or not. The method then proceeds to decision diamond 228 in which it is determined if a warning is indicated. If the warning indicator is not asserted, then no warning is indicated and the method is complete. If the warning indicator is asserted, then the method proceeds to block 230 in which the delay of programmable delay element 222 is reduced by a predetermined amount. This may be performed by control circuitry 200 by updating the values of the component select signals to achieve a reduced delay. The method proceeds to block 232 where the decreased delay value is used by monitoring circuit 220 to perform its test. The method proceeds to decision diamond 234 in which it is determined if a warning is indicated. If so, the method returns to block 230 in which the delay amount is again reduced such that a smaller delay is provided for the testing. If a warning is not indicated, though, the method proceeds to block 236 in which the most recently used delay which resulted in the warning being indicated provides the margin error. This margin error therefore represents the largest delay which did not result in a warning being indicated.

Note that in alternate embodiments, other methods may be used to determine the margin error. For example, a lower initial delay value may be used and iteratively increased to determine the margin error. Alternatively, a binary search method may be used to search for the delay which provides the margin error.

Note that with IC 10 of FIG. 3, any of the monitor circuits, such as monitor circuits 122, 124, and 126 can be implemented using a degradation monitor such as degradation monitor 220 which includes a programmable delay element. Furthermore, the programmable delay element of each monitor circuit may be independently controlled by corresponding control circuitry. Therefore, the margin error described in reference to FIG. 6 can be determined based on one or more warning indicators from IC 100 (such as described in FIG. 3). For example, the aggregated warning signal 136 may be used to determine the margin error for the aggregate of all circuits being monitored with aggregator 128. However, an individual warning indicator may be used, or any other combination of warning signals may be used to determine margin error of any portion of IC100.

Figure 7:
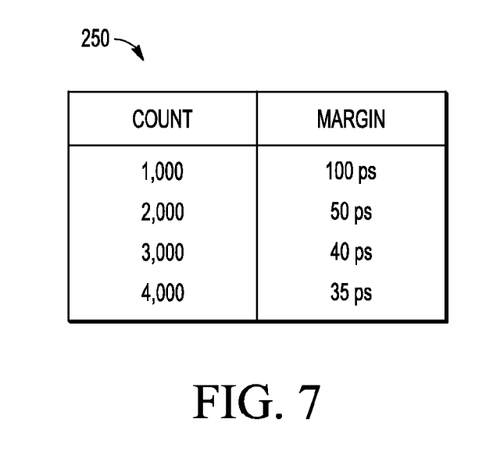
FIG. 7 illustrates, in table form, life counts of an integrated circuit and the corresponding delay margins, in accordance with one example.

By knowing the margin error, a prediction can be made as to the remaining useful life of IC 210. This information may be useful to determine during operation of IC 210, without the use of an external tester. The remaining useful life may refer to the amount of life or time remaining for which IC 210 can continue to operate properly. In one embodiment, margin errors are maintained in a table with respect to corresponding lifetime counts. For example, FIG. 7 illustrates a table 250 of exemplary counts and margin errors. The count can be provided by a counter within IC 210 (not shown) which can track clock counts over the lifetime of IC 210. Therefore, this count value may be indicative of the age of IC 210. In one embodiment, the counts correspond to the powering up of IC 210. Table 250 may be stored in storage circuitry 202 and accessed by control circuitry 200. In one embodiment, once a margin error is determined, table 250 may used to extrapolate a prediction as to how much useful life remains of IC 210. For example, if the margin error comes to 20 picoseconds (ps), a curve fit or extrapolation may be performed by control circuitry 200 to determine how many counts remain for IC 210, based on table 250. Furthermore, control circuitry 200 can periodically add new entries to table 250. Note that storage circuitry 202 may be included as part of control circuitry 200. Also, storage circuitry 202 may be configured to store one or more of the warning indicators of IC 100 at different times. This information may be used, for example, to update table 250.

In another embodiment, the ability to program delay element 222 allows for a user to provide frequency testing for improved binning of parts. For example, rather than adjusting the frequency for testing to determine a maximum frequency at which a part can operate, a fixed frequency may be provided, and the delay of programmable delay element 222 may instead be varied. If, for example, at a given frequency, the margin error is low, it is known there is not much ability left to increase the frequency further. That is, at a given frequency, the margin error may indicate if and how a maximum frequency of IC 210 can be determined.

By now it should be appreciated that a degradation monitoring circuit has been provided which determines differences in a data value and delayed data value at the input of a flip flop of a timing path in order to provide a warning that transitions of the data value have reached a critical timing margin. If the circuit continues to degrade beyond this point, an actual delay fault will soon occur. Furthermore, a sampling circuit is used to ensure that the differences in these values are detected with respect to an edge of a clock signal. Also, the warning indicators, when asserted, may be provided as a pulse that remains asserted while the clock remains at a first logic state (e.g. a logic level high) and reset each time the clock signal returns to a second logic state (e.g. a logic level low). In one embodiment, degradation monitors can be selectively placed within selected timing paths of an IC and their outputs can be aggregated to allow for a single warning indicator to be provided external to the IC. This aggregated warning indicator can indicate that circuit degradation has caused at least a portion of the IC to reach a critical timing margin, indicating that an actual delay default will likely occur upon any further circuit degradation. Also, by providing a programmable delay element within a degradation monitoring circuit, the margin error of all or a part of an IC can be determined. This information may be used to predict remaining useful life of a part or perform other analyses, such as maximum frequency determination.

The terms "assert" or "set" and "negate" (or "deassert" or "clear") are used herein when referring to the rendering of a signal, status bit, or similar apparatus into its logically true or logically false state, respectively. If the logically true state is a logic level one, the logically false state is a logic level zero. And if the logically true state is a logic level zero, the logically false state is a logic level one.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Although the invention is described herein with reference to specific embodiments, various modifications and changes can be made without departing from the scope of the present invention as set forth in the claims below. For example, different logic configuration may be used to implements the comparison, sampling, and hold circuits. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

The following are various embodiments of the present invention.

Item 1 includes an integrated circuit including a circuit including a timing path, the timing path including an input coupled to a clock signal line, the timing path including a data node, and a degradation monitoring circuit. The degradation monitoring circuitry includes a comparison circuit which includes a programmable delay element including an input coupled to the data node and including an output to provide a delayed signal of a data signal of the data node that is delayed by a programmable amount, and a logic comparator including a first input coupled to the data node and a second input coupled to the output of the programmable delay element, the logic comparator including an output to provide a logic comparison between a data signal of the data node and the output of the delay element. the degradation monitor circuit also includes a sampling circuit including a first input coupled to the output of the logic comparator and a second input coupled to the clock signal line, the sampling circuit including an output to provide a sampled signal of the output of the logic comparator that is sampled with respect to a clock signal of the clock signal line; and a hold circuit including a first input coupled to the output of the sampling circuit and a second input coupled to the clock signal line, wherein the hold circuit includes an output to provide a signal indicative of a data signal of the data node transitioning within a predetermined time of an edge transition of a clock signal of the clock signal line. Item 2 includes the integrated circuit of item 1 and further includes control circuitry including an output to provide a delay signal, wherein the programmable amount is controlled by the delay signal. Item 3 includes the integrated circuit of item 2, wherein the control circuitry receives information of the signal provided by the hold circuit. Item 4 includes the integrated circuit of item 2 wherein the control circuitry is configured to adjust the delay signal to determine a margin error for the circuit. Item 5 includes the integrated circuit of item 4 wherein the control circuitry uses the determined margin error to provide a prediction of remaining useful life of the circuit. Item 6 includes the integrated circuit of item 1 and further includes control circuitry, wherein the control circuitry receives information of the signal provided by the hold circuit. Item 7 includes the integrated circuit of item 6 wherein the control circuitry includes storage circuitry configured to store information of the signal provided by hold circuit provided at different times. Item 8 includes the integrated circuit of item 1 wherein the programmable delay element includes a plurality of delay components cascaded in series, wherein each delay component is controlled by a delay signal bit. Item 9 includes the integrated circuit of item 8 wherein each delay component includes delay path and a non delay path, wherein the delay signal bit is used to select which path is to be implemented in providing the programmable amount.

Item 10 includes a method including providing a data signal on a data node of a timing path of a circuit; delaying by a programmable amount, the data signal by a programmable delay element to provide a delayed data signal; comparing by a logical comparator the data signal to the delayed data signal to provide indications when the data signal and the delayed data signal are at different logic states; sampling the indications from the logical comparator to provide a sampled signal to indicate indications that occur during a particular portion of a clock cycle of a clock signal provided to the timing path, wherein in response to the sampled signal indicating an indication occurring at a particular portion of the clock cycle, a holding circuit provides an output signal at an indication state, for a particular amount of time, indicating the data signal transitioning within a predetermined time of an edge transition of the clock signal. Item 11 includes the method of item 10 and further includes changing the programmable amount to a second programmable amount that is different from the programmable amount; providing a second data signal on the data node; delaying by the second programmable amount, the second data signal by the programmable delay element to provide a second delayed data signal; comparing by a logical comparator the second data signal to the second delayed data signal to provide indications when the second data signal and the second delayed data signal are at different logic states; and sampling the indications from the logical comparator to provide a second sampled signal to indicate indications that occur during a particular portion of a clock cycle of a clock signal provided to the timing path, wherein in response to the second sampled signal indicating an indication occurring at a particular portion of the clock cycle, the holding circuit provides a second output signal at an indication state, for a particular amount of time, indicating the second data signal transitioning within a predetermined time of an edge transition of the clock signal. Item 12 includes the method of item 11, wherein the changing the programmable amount to a second programmable amount is performed in response to the holding circuit providing the output signal at an indication state, for a particular amount of time, indicating the data signal transitioning within a predetermined time of an edge transition of the clock signal. Item 13 includes the method of item 12, wherein changing the programmable amount to a second programmable amount is not performed in response to the output signal indicating that data signal does not transition within the predetermined time of the edge transition of the clock signal. Item 14 includes the method of item 12, wherein the programmable amount is greater than the second programmable amount. Item 15 includes the method of item 11, and further includes determining a margin error of the circuit by control circuitry using the output signal and the second output signal. Item 16 includes the method of item 15, and further includes using the margin error to determine a remaining useful life of the circuit. Item 17 includes the method of item 15 wherein the control circuitry and the circuit are located on a same integrated circuit. Item 18 includes the method of item 10 and further includes performing for a plurality of data signals the steps of providing, delaying, comparing and sampling, wherein the performing the steps includes using a different programmable amount of a plurality of programmable amounts; and determining a largest programmable amount of a plurality of programmable amounts for which the holding circuit does not provide an output signal at an indication state, for a particular amount of time, indicating the data signal of the plurality transitioning within a predetermined time of an edge transition of the clock signal. Item 19 includes the method of item 10, wherein the programmable delay is set by a control circuitry, wherein the control circuitry and the circuit are located on a same integrated circuit.

Item 20 includes an integrated circuit including a circuit including a timing path, the timing path including a flip flop, the flip flop including a data input, the flip flop including a clock input coupled to a clock signal line; and a degradation monitoring circuit. the degradation monitoring circuit includes a comparison circuit which includes a programmable delay element including an input coupled to the data input and including an output to provide a delayed signal of a data signal of the data input that is delayed by a programmable amount; and a logic comparator including a first input coupled to the data input and a second input coupled to the output of the delay element, the logic comparator including an output to provide a logic comparison between a data signal of the data input and the output of the delay element. The degradation monitoring circuit also includes a sampling circuit including a first input coupled to the output of the logic comparator and a second input coupled to the clock signal line, the sampling circuit including an output to provide a sampled signal of the output of the logic comparator that is sampled at a portion of a clock cycle of a clock signal of the clock signal line; and a hold circuit including a first input coupled to the output of the sample circuit and a second input coupled to the clock signal line, wherein the hold circuit includes an output to provide a signal indicative of a data signal of the data input transitioning within a predetermined time of an edge transition of a clock signal of the clock signal line.

What is claimed is:

1. An integrated circuit comprising:
   a circuit including a timing path, the timing path including an input coupled to a clock signal line, the timing path including a data node;
   a degradation monitoring circuit comprising:
      a comparison circuit, the comparison circuit comprising:
         a programmable delay element including an input coupled to the data node and including an output to provide a delayed signal of a data signal of the data node that is delayed by a programmable amount;
         a logic comparator including a first input coupled to the data node and a second input coupled to the output of the programmable delay element, the logic comparator including an output to provide a logic comparison between a data signal of the data node and the output of the delay element;
      a sampling circuit including a first input coupled to the output of the logic comparator and a second input coupled to the clock signal line, the sampling circuit including an output to provide a sampled signal of the output of the logic comparator that is sampled with respect to a clock signal of the clock signal line;
      a hold circuit including a first input coupled to the output of the sampling circuit and a second input coupled to the clock signal line, wherein the hold circuit includes an output to provide a signal indicative of a data signal of the data node transitioning within a predetermined time of an edge transition of a clock signal of the clock signal line.

2. The integrated circuit of claim 1 further comprising:
   control circuitry including an output to provide a delay signal, wherein the programmable amount is controlled by the delay signal.

3. The integrated circuit of claim 2 further wherein:
   the control circuitry receives information of the signal provided by the hold circuit.

4. The integrated circuit of claim 2 wherein the control circuitry is configured to adjust the delay signal to determine a margin error for the circuit.

5. The integrated circuit of claim 4 wherein the control circuitry uses the determined margin error to provide a prediction of remaining useful life of the circuit.

6. The integrated circuit of claim 1 further comprising:
   control circuitry, wherein the control circuitry receives information of the signal provided by the hold circuit.

7. The integrated circuit of claim 6 wherein the control circuitry includes storage circuitry configured to store information of the signal provided by hold circuit provided at different times.

8. The integrated circuit of claim 1 wherein the programmable delay element includes a plurality of delay components cascaded in series, wherein each delay component is controlled by a delay signal bit.

9. The integrated circuit of claim 8 wherein each delay component includes delay path and a non delay path, wherein the delay signal bit is used to select which path is to be implemented in providing the programmable amount.

10. A method comprising:
    providing a data signal on a data node of a timing path of a circuit;
    delaying by a programmable amount, the data signal by a programmable delay element to provide a delayed data signal;
    comparing by a logical comparator the data signal to the delayed data signal to provide indications when the data signal and the delayed data signal are at different logic states;
    sampling the indications from the logical comparator to provide a sampled signal to indicate indications that occur during a particular portion of a clock cycle of a clock signal provided to the timing path, wherein in response to the sampled signal indicating an indication occurring at a particular portion of the clock cycle, a holding circuit provides an output signal at an indication state, for a particular amount of time, indicating the data signal transitioning within a predetermined time of an edge transition of the clock signal.

11. The method of claim 10 further comprising:
    changing the programmable amount to a second programmable amount that is different from the programmable amount;
    providing a second data signal on the data node;
    delaying by the second programmable amount, the second data signal by the programmable delay element to provide a second delayed data signal;
    comparing by a logical comparator the second data signal to the second delayed data signal to provide indications when the second data signal and the second delayed data signal are at different logic states;
    sampling the indications from the logical comparator to provide a second sampled signal to indicate indications that occur during a particular portion of a clock cycle of a clock signal provided to the timing path, wherein in response to the second sampled signal indicating an indication occurring at a particular portion of the clock cycle, the holding circuit provides a second output signal at an indication state, for a particular amount of time, indicating the second data signal transitioning within a predetermined time of an edge transition of the clock signal.

12. The method of claim 11 wherein the changing the programmable amount to a second programmable amount is performed in response to the holding circuit providing the output signal at an indication state, for a particular amount of time, indicating the data signal transitioning within a predetermined time of an edge transition of the clock signal.

13. The method of claim 12 wherein changing the programmable amount to a second programmable amount is not performed in response to the output signal indicating that data signal does not transition within the predetermined time of the edge transition of the clock signal.

14. The method of claim 12 wherein the programmable amount is greater than the second programmable amount.

15. The method of claim 11 further comprising:
   determining a margin error of the circuit by control circuitry using the output signal and the second output signal.

16. The method of claim 15, further comprising: using the margin error to determine a remaining useful life of the circuit.

17. The method of claim 15 wherein the control circuitry and the circuit are located on a same integrated circuit.

18. The method of claim 10 further comprising:
   performing for a plurality of data signals the steps of providing, delaying, comparing and sampling, wherein the performing the steps includes using a different programmable amount of a plurality of programmable amounts;
   determining a largest programmable amount of a plurality of programmable amounts for which the holding circuit does not provide an output signal at an indication state, for a particular amount of time, indicating the data signal of the plurality transitioning within a predetermined time of an edge transition of the clock signal.

19. The method of claim 10 wherein the programmable delay is set by a control circuitry, wherein the control circuitry and the circuit are located on a same integrated circuit.

20. An integrated circuit comprising:
   a circuit including a timing path, the timing path including a flip flop, the flip flop including a data input, the flip flop including a clock input coupled to a clock signal line,
   a degradation monitoring circuit comprising:
      a comparison circuit, the comparison circuit comprising:
         a programmable delay element including an input coupled to the data input and including an output to provide a delayed signal of a data signal of the data input that is delayed by a programmable amount;
         a logic comparator including a first input coupled to the data input and a second input coupled to the output of the delay element, the logic comparator including an output to provide a logic comparison between a data signal of the data input and the output of the delay element;
      a sampling circuit including a first input coupled to the output of the logic comparator and a second input coupled to the clock signal line, the sampling circuit including an output to provide a sampled signal of the output of the logic comparator that is sampled at a portion of a clock cycle of a clock signal of the clock signal line;
   a hold circuit including a first input coupled to the output of the sample circuit and a second input coupled to the clock signal line, wherein the hold circuit includes an output to provide a signal indicative of a data signal of the data input transitioning within a predetermined time of an edge transition of a clock signal of the clock signal line.

* * * * *